United States Patent [19]

Bayraktaroglu

[11] Patent Number: 5,387,807
[45] Date of Patent: Feb. 7, 1995

[54] P-N JUNCTION DIFFUSION BARRIER EMPLOYING MIXED DOPANTS

[75] Inventor: Burhan Bayraktaroglu, Plano, Tex.

[73] Assignee: Texas Instruments Incorporated, Dallas, Tex.

[21] Appl. No.: 969,666

[22] Filed: Oct. 30, 1992

Related U.S. Application Data

[62] Division of Ser. No. 693,490, Apr. 30, 1991, Pat. No. 5,208,184.

[51] Int. Cl.[6] .................. H01L 29/227; H01L 29/73; H01L 29/90
[52] U.S. Cl. .................................. 257/197; 257/751; 257/603; 257/607
[58] Field of Search ............... 257/197, 198, 751, 603, 257/912, 913, 657, 545, 607; 437/96, 133

[56] References Cited

U.S. PATENT DOCUMENTS

| | | | |
|---|---|---|---|
| 4,575,576 | 3/1986 | Ludowise | 257/432 |
| 5,116,455 | 5/1992 | Daly | 437/81 |
| 5,132,764 | 7/1992 | Bayraktaroglu | 257/198 |
| 5,164,797 | 11/1992 | Thornton | 257/197 |

OTHER PUBLICATIONS

Barker et al; "Extremely High Peak Specific Transconductance AlGaAs/GaAs HBT"; IEEE vol. 10, No. 7, Jul. 1989, pp. 313-315.
Ito–"MOCVD Grown Carbon-doped Graded-Base AlGaAs/GaAs HBT"; Electronics letter, vol.–26 No. 23, Nov. 8, 1990 pp. 1977-1978.
H. Ito, "MOCVD Grown Carbon-Doped Graded–Base AlGaAs/GaAs HBTs," Electronics Letters, vol. 26, No. 23, Nov. 8, 1990, pp. 1977-1978.
W. S. Hobson, et al., "Carbon-Doped Base GaAs-AlGaAs HBT's Grown by MOMBE and MOCVD Regrowth," IEEE Electron Device Letters, vol. 11, No. 6, Jun. 1990, pp. 241-243.
S. Strite, et al., "Si as a Diffusion Barrier for Ge/GaAs Heterojunctions," Applied Physics Letters, vol. 56, No. 17, 23 Apr. 1990, pp. 1673-1675.
T. H. Chiu, et al., "Chemical Beam Epitaxial Growth of Strained Carbon–Doped GaAs," Applied Physics Letters, vol. 56, No. 2, 9 Jul. 1990, pp. 171-173.
D. Barker, et al., "Extremely High Peak Specific Transconductance AlGaAs/GaAs Heterojunction Bipolar Transistors," IEEE Electron Device Letters, vol. 10, No. 7, Jul. 1989, pp. 313-315.

*Primary Examiner*—Rolf Hille
*Assistant Examiner*—Wael Fahmy
*Attorney, Agent, or Firm*—Michael K. Skrehot; James C. Kesterson; Richard L. Donaldson

[57] ABSTRACT

Generally, and in one form of the invention, a p-n junction diffusion barrier is disclosed comprising a first semiconductor layer 28 of p-type conductivity, a second semiconductor layer 32 of n-type conductivity and a third semiconductor layer 30 of p-type conductivity disposed between the first and second layers, the third layer being doped with a relatively low diffusivity dopant in order to form a diffusion barrier between the first and the second semiconductor layers.

23 Claims, 4 Drawing Sheets

Fig. 2a    Fig. 2a1

P-N JUNCTION DIFFUSION BARRIER EMPLOYING MIXED DOPANTS

This is a division of application Ser. No. 07/693,490, filed Apr. 30, 1991 now U.S. Pat. No. 5,208,184.

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications are hereby incorporated herein by reference:

| Serial No. | Filing Date | TI Case No. |
|---|---|---|
| 672,809 | March 21, 1991 | TI-15801 |

FIELD OF THE INVENTION

This invention generally relates to p-n junction diffusion barriers employing mixed dopants.

BACKGROUND OF THE INVENTION

Without limiting the scope of the invention, its background is described in connection with the diffusion of dopants in the base layer of a heterojunction bipolar transistor (HBT), as an example.

Heretofore, in this field, it has been the object of device designers to develop HBTs to provide signal gain at microwave frequencies. A necessary consequence of this design goal is the formation of a structure that exhibits a low series base resistance, as base resistance is a major factor contributing to the maximum operating speed of the device. Generally, to lower the base resistance, designers have utilized a relatively heavy doping profile of the base layer. In base layers made from compound semiconductor materials, such as GaAs, high concentrations of p-type dopants such as Zn or Be are used.

It has been recognized that one of the factors that influence the reliability of microwave and high-speed heterojunction bipolar transistor (I-IBT) devices is the stability of the p-type dopant in the base layer. Heavy doping levels needed for good high frequency performance often cause a movement of commonly employed dopants under temperature and bias stress.

In the past, the use of carbon doping in metal organic chemical vapor deposition (MOCVD) systems has offered some relief to the diffusion problem since carbon has a low diffusivity in GaAs (a one-dimensional diffusion coefficient of $1$–$2 \times 10^{-16}$ cm$^2$/s compared with $1.5$–$2 \times 10^{-4}$ cm$^2$/s for Be and Zn). However, this solution presents inherent difficulties. For example, carbon doped GaAs has shown lattice constant change when incorporated at high levels ($>5 \times 10^{18}$ cm$^{-3}$) (see, for example, T. H. Chiu et al., "Chemical Beam Epitaxial Growth of Strained Carbon-Doped GaAs", *Applied Physics Letters*, vol. 57, p.171, 1990). This lattice constant change can cause a degradation of device performance by lowering minority carrier lifetime or by increasing the interface state density due to stress built-in to the structure.

Accordingly, improvements which overcome any or all of these problems are presently desirable.

SUMMARY OF THE INVENTION

It is herein recognized that a need exists for a p-n junction with a dopant diffusion barrier. The present invention is directed towards meeting those needs.

Generally, and in one form of the invention, a p-n junction diffusion barrier is disclosed comprising a first semiconductor layer of p-type conductivity, a second semiconductor layer of n-type conductivity and a third semiconductor layer of p-type conductivity disposed between the first and second layers, the third layer being doped with a relatively low diffusivity dopant in order to form a diffusion barrier between the first and the second semiconductor layers.

In another form of the invention, a transistor is disclosed which employs a p-n junction diffusion barrier comprising a first semiconductor layer of p-type conductivity, a second semiconductor layer of n-type conductivity and a third semiconductor layer of p-type conductivity disposed between the first and second layers, the third layer being doped with a relatively low diffusivity dopant in order to form a diffusion barrier between the first and the second semiconductor layers.

In yet another form of the invention, a method of making a p-n junction diffusion barrier is disclosed, comprising the steps of providing a first semiconductor layer of a p-type conductivity, depositing a second semiconductor layer of p-type conductivity on the first layer, the second layer doped with a relatively low diffusivity dopant in order to form a diffusion barrier between the first and a third semiconductor layer, and depositing the third semiconductor layer of an n-type conductivity on the second semiconductor layer.

In still another form of the invention, a method of making a transistor employing a p-n junction diffusion barrier is disclosed, comprising the steps of providing a first semiconductor layer of n-type conductivity, depositing a second semiconductor layer of p-type conductivity on the first layer, depositing a third semiconductor layer of p-type conductivity on the second layer, the third layer being doped with a relatively low diffusivity dopant in order to form a diffusion barrier between the second semiconductor layer and a fourth semiconductor layer, and depositing the fourth semiconductor layer on n-type conductivity on the third semiconductor layer.

An advantage of the invention is that the p-type layer can be heavily doped without danger of unwanted diffusion of p-type dopants into the adjoining n-type layer, due to the inclusion of the diffusion barrier between them.

BRIEF DESCRIPTION OF THE DRAWINGS

The foregoing and further aspects of the invention are illustrated in the accompanying drawings wherein like elements are denoted by like reference designators and in which:

FIGS. 2A–G is a cross sectional view, taken through section A—A' of FIG. 1, of a first preferred embodiment device of the present invention;

DETAILED DESCRIPTION OF PREFERRED EMBODIMENTS

The first preferred embodiment of the present invention describes a design method which minimizes the detrimental effects of carbon doping on HBT performance while maintaining the advantage of low diffusion of base dopants into the emitter layer.

Figure 1:
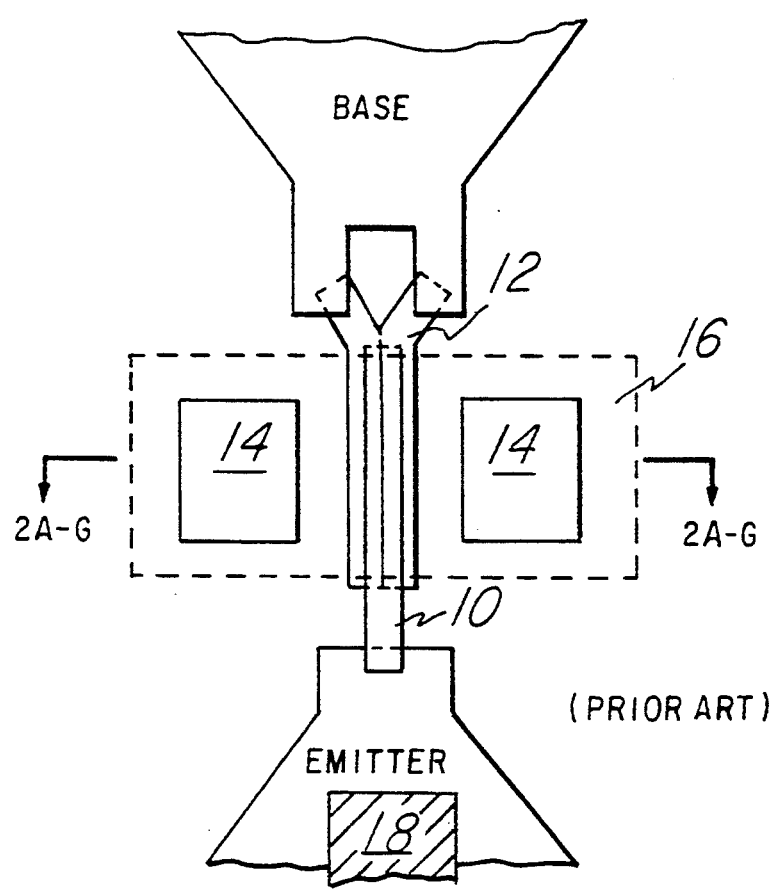
FIG. 1 is a plan view of a prior art heterojunction bipolar transistor without collector metallization.

A plan view of an HBT structure known in the art is illustrated in FIG. 1. It contains an emitter finger 10 which overlies base contact fingers 12. On either side of these fingers are collector contacts 14 which are contacted with an airbridge metallization structure (not shown). The active area 16 of the device is defined by ion implantation as is well known in the art. The first preferred embodiment of the present invention utilizes the prior art plan view of FIG. 1. The inventive and further aspects of the first preferred embodiment are most advantageously illustrated in the cross sectional views of FIGS. 2A–G, as discussed below.

FIGS. 2A–G illustrates the steps in the construction of the first preferred embodiment of the present invention as follows:

(a) As shown in FIG. 2A, a substrate 20, such as GaAs, is provided which includes an epitaxially grown buffer layer 22 of undoped AlGaAs on its surface. An n+ GaAs subcollector layer 24 is then epitaxially grown to a thickness of 1 micron and doped with silicon to a concentration of $2 \times 10^{18}$ atoms/cm$^2$, for example. An n-type GaAs collector layer 26 is then epitaxially grown to a thickness of I micron and doped with silicon to a concentration of $1 \times 10^{16}$ atoms/cm$^2$, for example. Next, a p-type GaAs base layer 28 is epitaxially deposited to a thickness of 0.1 micron and doped with Zinc to a concentration of $1 \times 10^{19}$ atoms/cm$^2$, for example. A p-type GaAs base diffusion barrier layer 30 is then epitaxially grown to a thickness of 0.02 micron and doped with Carbon to a concentration of $1 \times 10^{19}$ atoms/cm$^2$, for example. The heavily Zinc doped base layer 28 will provide the transistor with low base resistance which is required for high speed operation, while the Carbon doped base diffusion barrier layer 30 will provide a barrier to stop the Zinc atoms of layer 28 from migrating to the emitter layer 32, which is epitaxially deposited on top of base diffusion barrier layer 30 to a thickness of 0.41 micron, for example. Emitter layer 32 is preferably composed of the following sublayers, for example: an n-type GaAs sublayer 34 of 0.01 micron, doped with silicon to a concentration of $1 \times 10^{18}$ atoms/cm$^2$; an n-type AlGaAs emitter sublayer 36 (the wide bandgap of which provides the heterojunction effect) of 0.1 micron, doped with silicon to a concentration of $2 \times 10^{17}$ atoms/cm$^2$; an n-type grading sublayer 38 (which provides a smooth bandgap transition from AlGaAs to GaAs) of 0.05 micron, doped with silicon to a concentration of $5 \times 10^{17}$ atoms/cm$^2$; an n+ GaAs cap sublayer 40 (which provides a suitable surface for deposition of emitter metallization) of 0.1 micron, doped with silicon to a concentration of $1 \times 10^{18}$ atoms/cm$^2$; and an n+ GaAs cap sublayer 42 (which extends sublayer 40 and is more heavily doped) of 0.15 micron, doped with silicon to a concentration of $2 \times 10^{18}$ atoms/cm$^2$. After the formation of the above epilayers, device active area 16 is defined by ion implantation with oxygen, boron or protons to convert the surface outside of the active region into semi-insulating material.

Figure 2B:
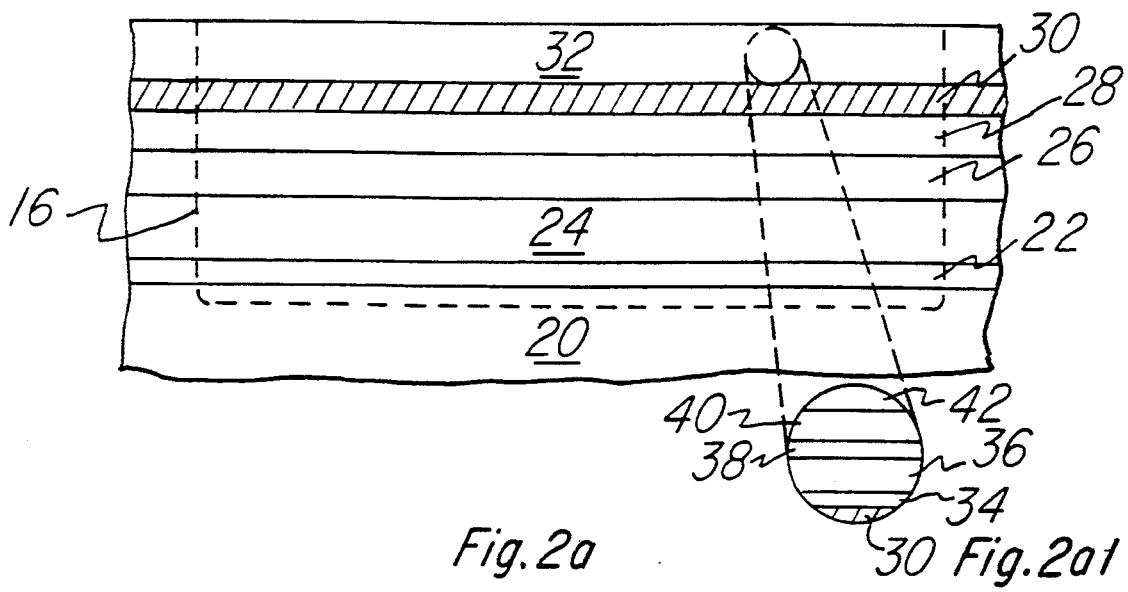
Figure 2B:
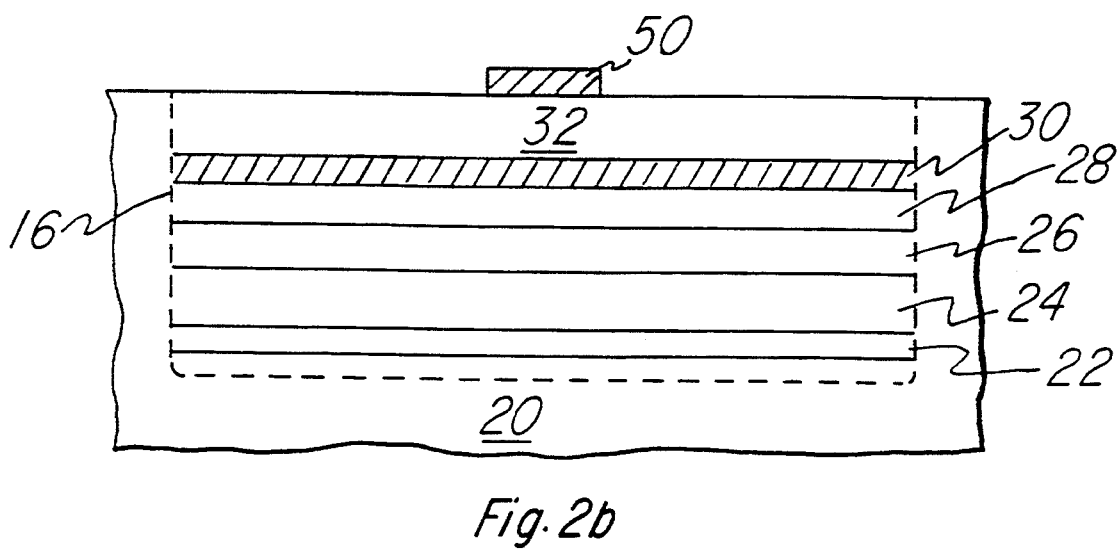

(b) As shown in FIG. 2B, photoresist is spun on and patterned to define the location of emitter finger contact 50. AuGe/Ni/Au metals are evaporated in sequence at thicknesses of 500, 140 and 4000 Angstroms, respectively, onto the photoresist and exposed areas. The photoresist is then removed, which lifts off the metal except that portion 50 that defines the emitter finger contact 50.

Figure 2C:
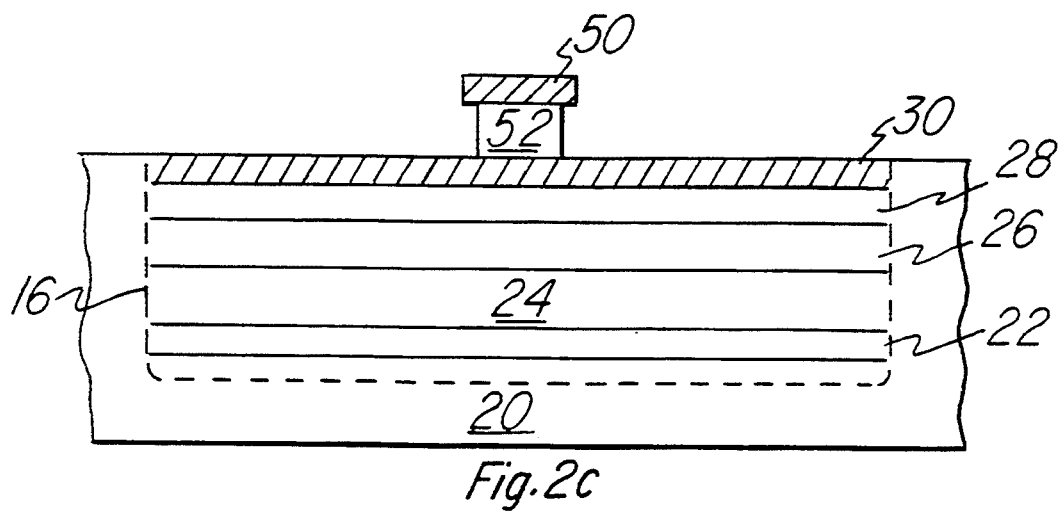

(c) As shown in FIG. 2C, emitter finger 52 is formed by etching all portions of the emitter epilayer 32 not masked by emitter finger contact 50 down to the base diffusion barrier epilayer 30 using a reactive ion etch (RIE in BCl$_3$, CCl$_2$F$_2$, or CCl$_4$) or similar anisotropic etch technique. It is preferred that a short chemical etch (using, for example, H$_2$SO$_4$:H$_2$O$_2$:H$_2$O in a ratio of 1:8:160 by volume) is used as a last part of this step in order to produce a small undercut of the emitter epilayer 32 material (this will isolate the emitter finger 50 from the base contact as described below in step (d)). The chemical etch will also remove the damaged layers produced by the RIE etch.

Figure 2D:
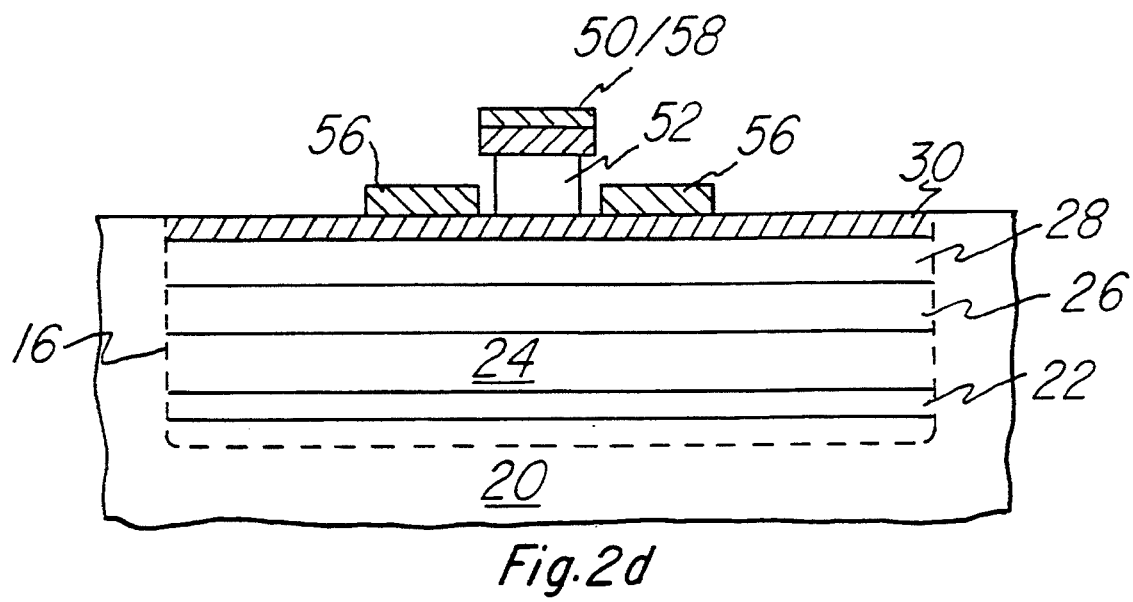

(d) The base contacts 56 of FIG. 2D are defined with photoresist and suitable base metals such as Ti/Pt/Au in thicknesses of 500, 250 and 2000 Angstroms, respectively, are sequentially evaporated onto the photoresist and exposed areas. As shown in FIG. 2D, the photoresist is then removed, which lifts off the metal except those portions 56 that define the base contacts and those portions 58 overlying emitter finger contact 50. Because of the undercut of the emitter finger 52 caused by the chemical etch in step (c), the emitter finger 52 and the base contacts 56 are self-aligned and will be separated by approximately 0.1–0.2 micron.

Figure 2E:
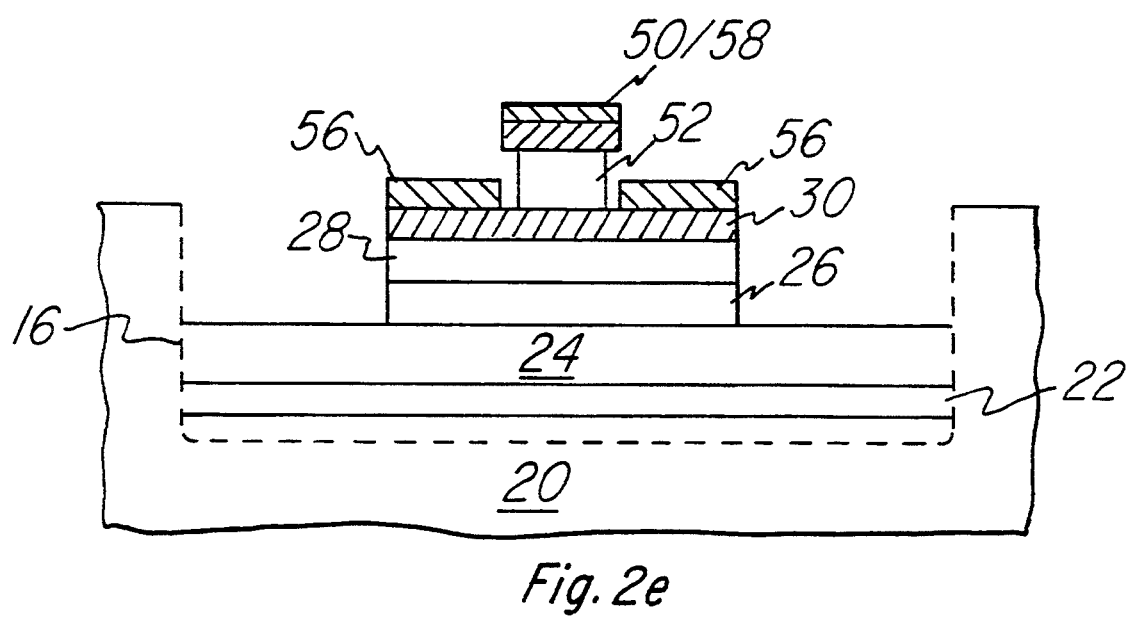

(e) The collector contact areas are defined by photoresist. Exposed areas are etched in RIE or wet chemical etchants down to the subcollector epilayer 24, as shown in FIG. 2E.

Figure 2F:
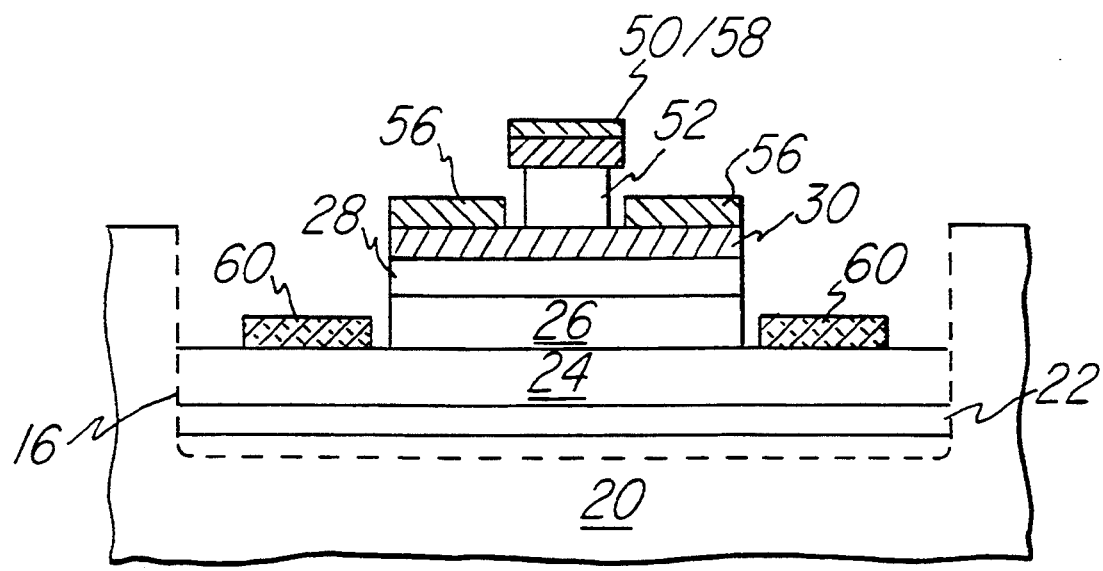

(f) The same photoresist layer is used for the evaporation and lift-off process which establishes collector contacts 60. As shown in FIG. 2F, AuGe/Ni/Au is evaporated in sequence at thicknesses of 500, 140 and 4000 Angstroms, respectively. The evaporation mask is then removed which lifts off all metal except in the collector contact 60 areas.

Figure 2G:
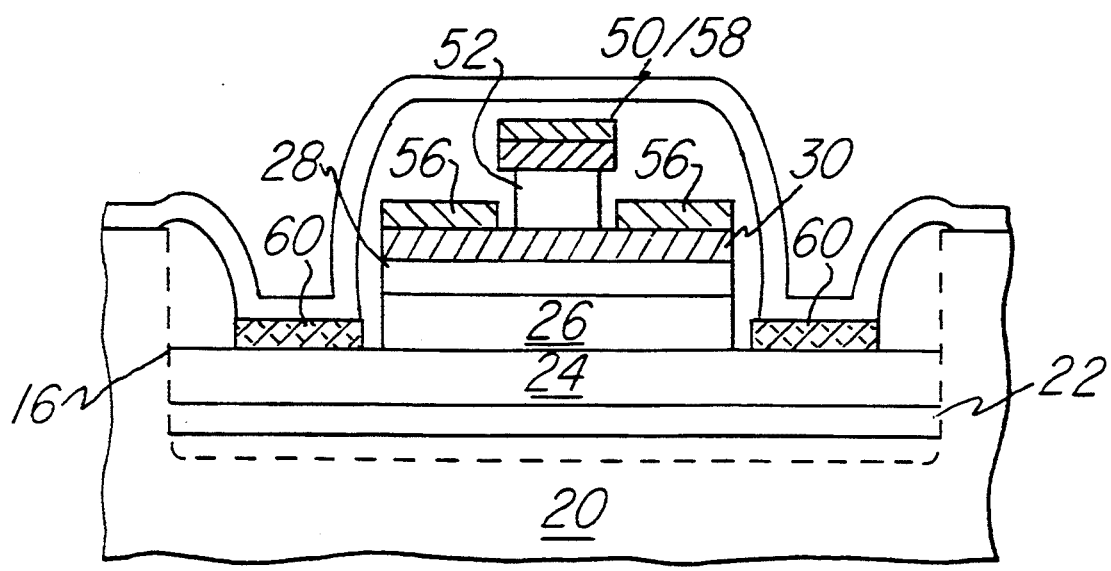

(g) The remainder of the transistor fabricating follows standard semiconductor processing techniques. An air bridge 70, as shown in FIG. 2G, is used to connect all collector contacts 60, passive circuit elements, such as capacitors and transmission lines, are fabricated, the wafer is lapped to the desired thickness and via holes 18 (see FIG. 1) are fabricated. These steps follow standard fabrication techniques.

The first preferred embodiment of the present invention has the advantage that an HBT can be formed with low base resistance, and therefore high operating frequency, by the use of the heavily Zinc doped base layer 28. If not for the inclusion of the carbon doped base diffusion barrier layer 30, Zinc diffusion into the emitter finger 52, driven by heat dissipated by the device and the forward biased base-emitter p-n junction, would degrade the device performance irreversibly over its operating lifetime, producing unstable and unpredictable device performance.

A few preferred embodiments have been described in detail hereinabove. It is to be understood that the scope of the invention also comprehends embodiments different from those described, yet within the scope of the claims.

For example, the carbon doped diffusion barrier can be used in relation to any two semiconductor layers where it is desired to control the diffusion of dopants from one layer into the other, such as diodes, transistors, lasers, etc.

Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A p-n junction diffusion barrier, comprising:
   a first semiconductor layer of p-type conductivity doped with a first dopant;
   a second semiconductor layer of n-type conductivity; and
   a third semiconductor layer of p-type conductivity disposed between said first and said second semiconductor layers, said third semiconductor layer doped with a second dopant having a lower diffusivity than said first dopant in order to form a dopant diffusion barrier between said first and said second semiconductor layers.

2. The p-n junction diffusion barrier of claim 1, wherein said first, said second and said third semiconductor layers are GaAs.

3. The p-n junction diffusion barrier of claim 1, wherein said first semiconductor layer is doped with Zinc.

4. The p-n junction of claim 1, wherein said second semiconductor layer is doped with Silicon.

5. The p-n junction diffusion barrier of claim 1, wherein said third semiconductor layer is doped with Carbon.

6. The p-n junction diffusion barrier of claim 1, wherein said third semiconductor layer is much thinner than said first semiconductor layer.

7. The p-n junction diffusion barrier of claim 1, wherein said first and said third semiconductor layers have substantially equal doping concentration.

8. The p-n junction diffusion barrier of claim 1, wherein said first, said second and said third semiconductor layers are epitaxially deposited.

9. The p-n junction of claim 8, wherein said first, said second and said third semiconductor layers are doped in situ.

10. A transistor employing a p-n junction diffusion barrier comprising:
    a first semiconductor layer of p-type conductivity doped with a first dopant;
    a second semiconductor layer of n-type conductivity;
    a third semiconductor layer of p-type conductivity disposed between said first and said second semiconductor layers, said third semiconductor layer doped with a second dopant having a lower diffusivity than said first dopant in order to form a dopant diffusion barrier between said first and said second semiconductor layers.

11. The transistor employing p-n junction diffusion barrier of claim 10 further comprising a fourth semiconductor layer; wherein said fourth semiconductor layer is of n-type conductivity and is disposed adjacent to said first semiconductor layer.

12. The transistor employing p-n junction diffusion barrier of claim 10 further comprising a fourth semiconductor layer, wherein said fourth semiconductor layer is of p-type conductivity and is disposed adjacent to said second semiconductor layer.

13. The transistor employing a p-n junction diffusion barrier of claim 10, wherein said first, said second, and said third semiconductor layers are GaAs.

14. The transistor employing a p-n junction diffusion barrier of claim 10, wherein said first semiconductor layer is doped with Zinc.

15. The transistor employing a p-n junction diffusion barrier of claim 10, wherein said second semiconductor layer is doped with Silicon.

16. The transistor employing a p-n junction diffusion barrier of claim 10, wherein said third semiconductor layer is doped with Carbon.

17. The transistor employing a p-n junction diffusion barrier of claim 11, wherein said fourth semiconductor layer is doped with Silicon.

18. The transistor employing a p-n junction diffusion barrier of claim 12, wherein said fourth semiconductor layer is doped with Zinc.

19. The transistor employing a p-n junction diffusion barrier of claim 10, wherein said third semiconductor layer is much thinner than said first semiconductor layer.

20. The transistor employing a p-n junction diffusion barrier of claim 10, wherein said first and third semiconductor layers have substantially equal doping concentration.

21. The transistor employing a p-n junction diffusion barrier of claim 10, wherein said first, said second, and said third semiconductor layers are epitaxially deposited.

22. The transistor employing a p-n junction diffusion barrier of claim 21, wherein said first, said second, and said third semiconductor layers are doped in situ.

23. The transistor employing a p-n junction diffusion barrier of claim 10, wherein said transistor is a heterojunction bipolar transistor.

* * * * *